United States Patent
Kikuyama et al.

(10) Patent No.: US 6,797,194 B1
(45) Date of Patent: Sep. 28, 2004

(54) SURFACE TREATING FOR MICROMACHINING AND METHOD FOR SURFACE TREATMENT

(75) Inventors: Hirohisa Kikuyama, Osaka-fu (JP);
Masayuki Miyashita, Osaka-fu (JP);
Tatsuhiro Yabune, Osaka-fu (JP);
Tadahiro Ohmi, Miyagi-ken (JP)

(73) Assignee: Stella Chemifa Kabushiki Kaisha (JP)

( * ) Notice: Subject to any disclaimer, the term of this patent is extended or adjusted under 35 U.S.C. 154(b) by 0 days.

(21) Appl. No.: 09/622,397
(22) PCT Filed: Feb. 26, 1999
(86) PCT No.: PCT/JP99/00936
§ 371 (c)(1),
(2), (4) Date: Dec. 1, 2000
(87) PCT Pub. No.: WO99/44227
PCT Pub. Date: Sep. 2, 1999

(30) Foreign Application Priority Data

Feb. 27, 1998 (JP) .......................... 10-048019

(51) Int. Cl.⁷ .............................................. C09K 13/00
(52) U.S. Cl. ........................... 252/79.1; 134/3; 438/689
(58) Field of Search ............................ 252/79.1, 79.3, 252/79.4; 134/3; 438/689, 690, 745, 753, 756

(56) References Cited

U.S. PATENT DOCUMENTS

| 4,059,480 A | * | 11/1977 | Ruh et al. ..................... 347/47 |
| 4,210,689 A | * | 7/1980 | Komatsu ..................... 257/515 |
| 4,795,582 A | * | 1/1989 | Ohmi et al. ................... 216/99 |
| 5,534,460 A | * | 7/1996 | Tseng et al. ................. 438/660 |
| 6,027,571 A | * | 2/2000 | Kikuyama et al. ............. 134/3 |
| 6,242,331 B1 | * | 6/2001 | Chu et al. .................... 438/586 |

FOREIGN PATENT DOCUMENTS

| JP | 63-283028 | 11/1988 | ......... H01L/21/306 |
| JP | 3-179737 | 8/1991 | ......... H01L/21/308 |
| JP | 5-82503 | 4/1993 | ......... H01L/21/308 |

OTHER PUBLICATIONS

Patent Cooperation Treaty International Preliminary Examination Report dated Mar. 27, 2000.

* cited by examiner

Primary Examiner—Kin-Chan Chen
(74) Attorney, Agent, or Firm—Randall J. Knuth

(57) ABSTRACT

The present invention provides a micromachining surface treatment material for and a surface treatment method that suppress widening of the diameter of contact holes when removing a natural oxidation layer arising at bottom sections of the contact holes. The micromachining surface treatment material contains less than 0.1% hydrofluoric acid, and more than 40% by weight but less than or equal to 47% by weight of ammonium fluoride. Also, a surfactant is contained therein in an amount from 0.0001 to 0.1% by weight.

6 Claims, No Drawings

SURFACE TREATING FOR MICROMACHINING AND METHOD FOR SURFACE TREATMENT

BACKGROUND OF THE INVENTION

1. Field of the Invention

The present invention relates to a surface treating for micromachining and surface treatment method, and more specifically to a surface etching material and a surface etching method using this material that are extremely effective when used for cleaning in a wet process for microscopic processing of oxide at the time of manufacturing a semiconductor element, and for cleaning a surface or a semiconductor element surface that has been microscopically processed.

2. Description of the Related Art

In wet processes for semiconductor integrated circuits, there are increasing demands for cleaning, precision and increase in speed for cleaning, etching and patterning of a wafer surface and a micromachined surface accompanying the development of integrated circuits. A mixed solution of HF and ammonium fluoride ($NH_4F$) (buffered hydrofluoric acid), along with a micromachining surface treatment material essential to this process, is used for the purpose of cleaning, etching and patterning, but for ultra high integration in the submicron range there is a need to improve performance and functionality.

Particularly, with the advancement of high integration, it has become possible to make contact holes as small as 0.25 μm, or 0.18 μm. The number of wires and the number of manufacturing steps have also increased. Also with respect to interlayer insulation film, as well as conventional CVD films, organic TEOS films are also being used.

When this TEOS film is used, a heat treatment process is carried out at a temperature of 500° C. to 800° C., but with the advancement of microscopic techniques, when making a 1 Gbit DRAM in which the wiring width and the material are limited, it is necessary for the heat treatment temperature to be kept to 500° C. at the edge of a transistor and less than 250 to 300° C. in the vicinity of the interlayer insulation film. If the heat treatment temperature is lowered, a CVD oxidation film or a TEOS film etc. have an extremely slow etching rate compared to HF chemical solution.

Also, when contact holes are processed by dry etching, for example, when dry etching is carried out with, for example, a diameter of 0.18 μm and a depth of 1 to 2 μm, precedence is given to dimensional accuracy and etching shape, which means that currently etching is performed with no consideration given to damage of the bottom of the contact holes. As a result, a substrate or a polysilicon film at the bottom of the holes is subjected to damage, and in particular about 20 nm of a substrate surface approaches amorphous silicon. Also, in the vicinity of a lower 30 nm of the substrate, is doped by ion injection of CF, being a dry etching gas.

In order to eliminate this damage, or when removing resist, a cleaning stage is becoming increasingly important, and, for example, RCA cleaning is becoming absolutely essential, but if this type of cleaning is carried out a natural oxidation film is formed, and a method of removing this natural oxidation film poses a problem.

Conventionally, removal of this type of natural oxidation film mainly utilized rare HF or buffered hydrofluoric acid (BHF). In the case of BHF it was possible to use a chemical solution of, for example, 100:1 BHF (40% $NH_4F$:50% HF=100:1) to etch a thermal oxidation film at 25° C., at about 10 nm/min.

However, when removing a natural oxidation film at the bottom of contact holes opening onto an oxidation film (a TEOS film) heat treated at a low temperature, since the etching rate of the TEOS film of a side wall having a low heat treatment temperature is extremely slow, it is possible that holes of 0.25 μm diameter will be widened to 0.5 μm after cleaning. Specifically, with rare HF or 100:1 BHF, removal of a natural oxidation film is difficult from a practical standpoint without widening the hole diameter. For this reason, conventionally, patterning was performed for a 0.2 μm hole and a margin was designed in to allow for widening due to etching. However, with the continuing progress with respect to fine patterning, with 0.18 μm and 0.15 μm design rules even that margin is not permissible.

In the removal of a natural oxidation film formed at the bottom of contact holes, it is necessary to make a selective etching ratio of the natural oxidation film etching rate to the side wall (CVD film, TEOS film etc.) etching rate large. That is, it is actually desirable to remove only the natural oxidation film. However, from a practical standpoint, the natural oxidation film etching rate is high compared to that of the CVD film or the TEOS film, and when also taking mass production processes into consideration, the time required to remove the natural oxidation film is not necessarily as short as possible. Therefore, when a wafer is processed using a wet station, in the case of an 8 inch wafer, batch processing using a cassette containing 25 wafers at one time is most common. The problem in this situation is the time to convey the wafer cassette from an etching chamber to a purified water chamber. Accordingly, the time for removing the natural oxidation film is desirably from 30 seconds to a minute, which can be mechanically controlled Specifically, if the time taken to remove the natural oxidation film is about 10 seconds, the time that the wafer is in contact with processing fluid eventually becomes about one minute when taking into consideration over-etching time for complete removal and conveyance time. As a result, the side wall sections of the contact holes are etched for the same amount of time.

Accordingly, the object of the present invention is to provide a surface treating for micromachining and surface treatment method that fixes etching time to about one minute, slows an etching rate of a natural oxidation film as much as possible in this range of etching time, and enables a selection ratio to that for a CVD oxidation film or a TEOS film to be made small.

SUMMARY OF THE INVENTION

The micromachining surface treatment material of the present invention contains less than 0:1% hydrofluoric acid, and more than 40% by weight but less than or equal to 47% by weight of ammonium fluoride.

The micromachining surface treatment material of the present invention is manufactured by dissolving ammonia gas in a hydrofluoric acid solution.

Further, the micromachining surface treatment material of the present invention contains a surfactant at 0.0001 to 1% by weight.

The present invention also provides a surface processing method for removing a natural oxidation layer inside a contact hole using the above described micromachining surface treatment material.

DETAILED DESCRIPTION OP THE INVENTION

Description will now be given of the reasons for compositional range limitations for each of the above described components.

A micromachining surface treatment material of the related art, particularly buffered hydrofluoric acid, is manufactured using a mixture of 40% by weight of $NH_4F$ and 50% by weight of HF, which means that the concentration of $NH_4F$ has an upper limit of 40% by weight.

The inventors of the present invention have discovered a method of manufacturing buffered hydrofluoric acid in which a $NH_4F$ concentration is made higher than the 40% by weight of the related art by mixing $NH_3$ gas and HF, and that $NH_4F$ at a high concentration slows the etching rate of a CVD film or TEOS film and has sufficient performance with respect to removing a natural oxidation film. However, if with greater than 45% by weight, more crystals are deposited than chemical solution, it is difficult to advance etching response and it is easy for variations to occur, so the preferred $NH_4F$ concentration is less than or equal to 45% by weight, and the upper limit is 47% by weight.

Also, the temperature range for the chemical solution is preferably from 20 to 25° C. The temperature within the chamber is also preferably 23 to 25° C.

Specifically, with $NH_4F$ at 47% by weight and a HF concentration of 0.005% by weight, the crystal precipitation temperature becomes about 30° C. and it is necessary to increase the temperature of an etching bath. It is also necessary to heat a chemical solution tank and piping, which is not practical.

Accordingly, in order to set the crystal precipitation temperature to 30° C. or less the $NH_4F$ concentration is preferably 45% by weight or less.

The reason for the upper limit of 47% by weight is as follows. Specifically, cleaning and etching itself does not cause a problem with 47% by weight of $NH_4F$. However, if the $NH_4F$ concentration becomes greater than 47% by weight the crystal precipitation temperature increases abruptly and control becomes difficult.

As one example, with a $NH_4F$ concentration of 49% by weight, the crystal precipitation temperature rises to 45° C. The crystal precipitation temperature rises by nearly 15° C. because of a 2% change from 47% by weight to 49% by weight.

Accordingly, large errors do not arise because of the cleaning or etching capabilities themselves, but if temperatures rise due to difficulties in control and $NH_4F$ concentration caused by chemical evaporation because of the high temperatures employed, the concentration range of $NH_4F$ that can be used has an upper limit of 47% by weight and is preferably less than or equal to 4.5% by weight.

The lower limit of the HF concentration in the micromachining surface treatment material of the present invention is 0.001% by weight. This is the concentration at which etching can be noticed. As an example, the etching rate of an oxide film is 0.001 Å/min at 25° C.

The micromachining surface treatment material of the present invention preferably contains a surfactant. The included amount is preferably 0.001 to 1% by weight, and more preferably 0.005% by weight to 0.1% by weight (50 ppm to 1000 ppm). At a concentration lower than 0.001% by weight, the effect of addition is hardly noticeable, and at greater than 1% by weight the effects are the same.

The reason a surfactant is included is as follows. Specifically, if a resist interval is about 0.5 μm or less, there is a problem that it is difficult for the micromachining surface treatment material to wet the oxide film, which means that uniformity of etching the oxide film is lowered, but by adding the surfactant, wettability to the resist surface is improved, and uniformity of etching the oxide film is significantly improved. Also, When an Si surface is exposed, surface roughness can be suppressed by the surfactant, and it is possible to realize a higher performance device.

Further, if the $NH_4F$ becomes greater than a saturation, concentration crystals precipitate, but once crystals precipitate there is a problem in that it is difficult for the crystals to return to a uniform solution at a temperature that is slightly higher. These crystals must be removed because they cause variations such as etching unevenness in particle form, but by adding the surfactant it is possible to prevent crystal particles attaching to the surface of a wafer, even if crystals do precipitate.

As the surfactant of the present invention, a fatty amine ($C_nH_{2n+1}NH_2$; n=7 to 14), a fatty carboxylic acid ($C_nH_{2n+1}COOH$; n=5 to 11), or a fatty alcohol ($C_nH_{2n+1}OK$; n=6 to 12) is preferably used. In particular, at least one of these three types of surfactant is preferably mixed, and preferably selected according to the $NH_4F$ concentration and HF concentration. Also, an isostructure is possible even if the carbon chain sections of these surfactants are linear. A particularly preferred surfactant is a fatty amine and a fatty carboxylic acid A manufacturing method for the micromachining surface treatment material of the present invention, as described above, can be exemplified by a method for dissolving high purity $NH_4F$ powder in HF, or a method for causing $NH_3$ gas to be absorbed in ultra pure water, manufacturing a high purity aqueous solution of $NH_4OH$ at high concentration and mixing this with 50% by weight of HF, as well as a method for causing $NH_3$ gas to be absorbed in a HF solution (or a method for causing $NH_3$ gas to be absorbed in a HF solution to manufacture high concentration $NH_4F$ and mixing this with 50% by weight of HF at a desired ratio), but a method of causing $NH_3$ gas to be absorbed in an aqueous HF solution to obtain even higher purity is most preferred. $NH_3$ gas is caused to be absorbed in the HF aqueous solution by surface absorption or a bubbling process.

The micromachining surface treatment material of the present invention is preferably used to remove a natural oxidation film occurring on a Si surface inside contact holes formed inside an oxide film, as will be described later. Also, it does not matter whether or not heat treatment is carried out for the following oxidation films.

Oxidation film (dry oxidation film, wet oxidation film)
CVD oxidation film:non-doped
CVD oxidation film:PSG film (P-doped 1 to 8% by weight)
CVD oxidation film:BSG film (B-doped 1 to 8% by weight)
CVD oxidation film:AsSG film (As-doped 1 to 8% by weight)
CVD oxidation film:BPSG film (B, P-doped 1 to 8% by weight each)
AsSG film using ion injection:(As-doped 1 to 8% by weight)
PSG film using ion injection:(P-doped 1 to 8% by weight)
and TEOS film:non-doped film
doped TEOS film:B, P doped film, 1 to 8% by weight each The present invention is described in more detail in the following with reference to the embodiments, but the present invention is not limited to these embodiments.

(Embodiment 1)

An example of results of evaluating chemical composition and etching-rate, taking a thermal oxidation film, plasma TESO (PL-TEOS) film and natural oxidation film as examples, is shown in Table 1.

In this embodiment, a thermal oxidation film is formed at 1000° C. using pyrogenic oxidation ($H_2:O_2=1:1$). Also, a PL-TEOS film is formed by a CVD method using TEOS ($Si(OC_2H_5)_4$) and oxygen gas at 400° C. A natural oxidation film is formed by dipping in a mixed solution of 98% $H_2SO_4$ and 31% $H_2O_2$.

On the other hand the etching rate is obtained as follows.

A thermal oxidation film, or a CVD or TEOS type oxidation film has film thickness measured before and after immersion in chemical solution using an optical film thickness measuring device, and etching rate is calculated from the immersion time and the amount of reduction in film thickness. The natural oxidation film has its film thickness optically measured before immersion, the wafer immersion time is varied from 3 seconds, 5 seconds, 10 seconds . . . etc. and confirmation that the natural oxidation film was removed was carried out by observing the water repellent state of the wafer at those times, and etching rate was then calculated.

Here, the film thickness of the natural oxidation film has values that are converted to film thickness of the thermal oxidation film, from comparison of the ESCA Si peak strength and ellipsometrically measured film thickness of the thermal oxidation film and the natural oxidation film.

TABLE 1

| Chemical Composition | | Etching rate (nm/min) at 25° C. | | |
|---|---|---|---|---|
| HF concentration | $NH_4F$ concentration | Thermal Oxidation Film | PL-TEOS | Natural Oxidation Film |
| 0.5 | 39.6 | 9.0 | 15.0 | 45.0 |
| 0.25 | 39.8 | 5.1 | 9.0 | 28.0 |
| 0.12 | 41.0 | 3.0 | 6.0 | 13.0 |
| 0.10 | 41.0 | 2.8 | 4.5 | 9.0 |
| 0.09 | 39.9 | 2.7 | 5.5 | 11.0 |
| 0.09 | 17.0 | 2.6 | 9.5 | 36.0 |
| 0.09 | 40.01 | 2.5 | 8.5 | 9.2 |
| 0.03 | 45.0* | 2.0 | 3.0 | 6.0 |
| 0.001 | 45.0* | 0.2 | 0.5 | 1.0 |

*The chemical composition has precipitation of crystals at 25° C., so the etching data at 35° C. is shown.

As is clear from table 1, if a chemical solution having a HF concentration of less than or equal to 0.1% by weight and a $NH_4F$ concentration higher than 40% by weight is used, the etching rate of the PL-TEOS or the thermal oxidation film are close to the etching rate of the natural oxidation film.

(Embodiment 2)

An example of evaluating chemical composition and etching rate similarly to embodiment 1, taking a thermal oxidation film, TEOS-BPSG film and natural oxidation film as examples, is shown in Table 2. The natural oxidation film and thermal oxidation film are formed in the same way as in embodiment 1.

The TEOS-BPSG film is formed by a normal pressure CVD, method, using TEOS, $O_3$, TMOP (($CH_3O_3PO$), TMB (($CH_3O)_3B$) at 400° C.

TABLE 2

| Chemical Composition | | Etching rate (nm/min) at 25° C. | | |
|---|---|---|---|---|
| HF concentration | $NH_4F$ concentration | Thermal Oxidation Film | TEOS-BPSG film | Natural Oxidation Film |
| 0.5 | 39.6 | 9.0 | 36.1 | 45.0 |
| 0.25 | 39.8 | 5.1 | 22.8 | 28.0 |
| 0.12 | 41.0 | 3.0 | 11.9 | 13.0 |
| 0.10 | 41.0 | 2.8 | 6.6 | 9.0 |
| 0.09 | 39.9 | 2.7 | 9.5 | 11.0 |
| 0.09 | 17.0 | 2.6 | 27.4 | 36.0 |
| 0.09 | 40.01 | 2.5 | 8.5 | 9.2 |
| 0.03 | 42.0 | 1.5 | 2.5 | 4.5 |
| 0.001 | 42.0* | 0.1 | 0.3 | 0.6 |

As is clear from table 2, if a chemical solution having a HF concentration of less than or equal to 0.1% by weight and a $NH_4F$ concentration higher than 40% by weight is used, the etching rate of the TEOS-BPSG film or the thermal oxidation film are close to the etching rate of the natural oxidation film.

(Embodiment 3)

An $O_3$-TEOS film and a PL-TEOS film were formed to 1 μm on a silicon wafer, and 0.5 μm contact holes were formed by photolithography and dry etching. Following that, resist peeling and RCA cleaning were carried out, and after that the wafer was brought into contact with the various chemical solutions shown in Table 3 for one minute, and the natural oxidation film (10 nm) was removed.

The diameter of the contact holes after processing was observed using an SEM, and the results are shown in table 3.

The $O_3$-TESO film was formed by normal pressure CVD using TEOS and $O_3$ at 350° C.

TABLE 3

| Chemical Composition | | Contact Hole Size (μm) | | |
|---|---|---|---|---|
| HF concentration | $NH_4F$ concentration | Initial Value | PL-TEOS film | $O_3$-TESO Film |
| 0.5 | 39.6 | 0.5 | 0.53 | 0.60 |
| 0.25 | 39.8 | 0.5 | 0.53 | 0.55 |
| 0.12 | 41.0 | 0.5 | 0.51 | 0.52 |
| 0.10 | 41.0 | 0.5 | 0.51 | 0.51 |
| 0.09 | 39.9 | 0.5 | 0.51 | 0.52 |
| 0.09 | 17.0 | 0.5 | 0.52 | 0.57 |
| 0.09 | 41.0 | 0.5 | 0.50 | 0.51 |
| 0.03 | 42.0 | 0.5 | 0.50 | 0.50 |
| 0.001 | 45.0 | 0.5 | 0.50 | 0.50 |

As shown in Table 3, it will be understood that by using a chemical composition with a HF concentration of less than or equal to 0.1% by weight and a NH4F concentration in excess of 40% by weight, widening of the contact holes formed in the $O_3$-TEOS film and the PL-TEOS film is suppressed and it is possible to obtain the designed hole diameter.

(Embodiment 4)

Similarly to embodiment 3, 0.25 μm contact holes were formed, and the contact hole diameter was observed using SEM after removal of a natural oxidation film using various chemical solutions, and the results are shown in Table 4.

TABLE 4

| Chemical Composition | | Contact Hole Size (μm) | | |
|---|---|---|---|---|
| HF concentration | $NH_4F$ concentration | Initial Value | PL-TEOS film | $O_3$-TESO Film |
| 0.5 | 39.6 | 0.25 | 0.28 | 0.33 |
| 0.25 | 39.8 | 0.25 | 0.27 | 0.30 |

TABLE 4-continued

| Chemical Composition | | Contact Hole Size (μm) | | |
|---|---|---|---|---|
| HF concentration | NH$_4$F concentration | Initial Value | PL-TEOS film | O$_3$-TESO Film |
| 0.12 | 41.0 | 0.25 | 0.26 | 0.28 |
| 0.10 | 41.0 | 0.25 | 0.25 | 0.26 |
| 0.09 | 39.9 | 0.25 | 0.26 | 0.27 |
| 0.09 | 17.0 | 0.25 | 0.27 | 0.32 |
| 0.09 | 41.0 | 0.25 | 0.25 | 0.26 |
| 0.03 | 42.0 | 0.25 | 0.25 | 0.25 |
| 0.001 | 45.0 | 0.25 | 0.25 | 0.25 |

As shown in Table 4, it will be understood that by using a chemical composition with a HF concentration of less than or equal to 0.1% by weight and an NH4F concentration in excess of 40% by weight, widening of the contact holes formed in the O$_3$-TEOS film and the PL-TEOS film is suppressed, even in the case of contact holes of 0.25 μm in diameter, and it is possible to obtain the designed hole diameter.

(Embodiment 5)

It will be shown that the number of contact hole defective regions is different, depending on whether or not a surfactant is used.

Using a chemical having a HF concentration of 0.05% and a NH4F concentration of 42%, 0.5 μm contact holes were formed at 25° C., and confirmation of interference color of a remaining oxide, film was carried out by light microscopy.

TABLE 5

| | |
|---|---|
| Thermal oxidation film: | 5000 Å |
| Positive resist film thickness: | 0.7 μm |
| Etching time: | 20 minutes |
| Is surfactant added? | 0.5 μm contact hole defective regions (per 1000 places) |
| Yes | 1 |
| Yes | 0 |
| No | 277 |
| No | 95 |

It was confirmed that by using the surfactant, the contact hole defective regions were significantly reduced.

(Embodiment 6)

It will be shown that the number of contact hole defective regions is different depending on the added concentration of surfactant.

Using chemicals having an HF concentration of 0.05% and an NH4F concentration of 41%, the temperature of the surfactant was varied, 0.5 μm contact holes were formed at 25° C., and confirmation of interference color of a remaining oxide film was carried out by light microscopy.

TABLE 6

| Added concentration of surfactant (% by weight) | 0.5 μm contact hole defective regions (per 1000 places) |
|---|---|
| 0.005 | 1 |
| 0.002 | 10 |

TABLE 6-continued

| Added concentration of surfactant (% by weight) | 0.5 μm contact hole defective regions (per 1000 places) |
|---|---|
| 0.0009 | 77 |
| 0.0005 | 138 |

It was confirmed that if the concentration of the surfactant is less that 0.001% by weight, the number of contact hole defects became large.

INDUSTRIAL APPLICABILITY

Using the micromachining surface treatment material and surface processing method of the present invention, it is possible to remove a natural oxidation film occurring at the bottom of contact holes while suppressing etching of a contact hole side wall oxidation film.

Specifically, using the micromachining surface treatment material and surface processing method of the present invention, when removing a natural oxidation film, if expansion in hole diameter is less than 5% it can be kept within the variation range of a photolithographic process. As a result, a microscopic, etching process is made easy, and a processing dimension margin is maintained, which means that it is possible to achieve improvement in semiconductor manufacturing yield.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A micromachining surface treatment material containing less than 0.1% by weight of hydrofluoric acid, and more than 40% by weight, but less than or equal to 47% by weight of ammonium fluoride.

2. The micromachining surface treatment material of claim 1, manufactured by dissolving ammonia gas in a hydrofluoric acid solution.

3. The micromachining surface treatment material of claim 2, containing a surfactant at 0.0001 to 1% by weight.

4. The micromachining surface treatment material of claim 1, containing a surfactant at 0.0001 to 1% by weight.

5. The micromachining surface treatment material of claim 4, said surfactant is one of, or two or more of, a fatty amine ($C_nH_{2n+1}NH_2$; n=7 to 14), a fatty carboxylic acid ($C_nH_{2n+1}COOH$; n=5 to 11), or a fatty alcohol ($C_nH_{2n+1}OH$; n=6 to 12).

6. A micromachining surface treatment material containing between about 0.03% to about 0.09% by weight of hydrofluoric acid and between about 41% and about 44% by weight of ammonium fluoride.

* * * * *